US006958915B2

(12) United States Patent
Wang et al.

(10) Patent No.: US 6,958,915 B2
(45) Date of Patent: Oct. 25, 2005

(54) HEAT DISSIPATING DEVICE FOR ELECTRONIC COMPONENT

(75) Inventors: Yaxiong Wang, Austin, TX (US); Chung-Yuan Huang, Austin, TX (US); Shun Chi Dong, Austin, TX (US)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 189 days.

(21) Appl. No.: 10/681,390

(22) Filed: Oct. 7, 2003

(65) Prior Publication Data

US 2005/0073811 A1    Apr. 7, 2005

(51) Int. Cl.$^7$ .............................................. H05K 7/20
(52) U.S. Cl. .................... 361/709; 361/696; 361/702; 361/703; 361/697; 361/710; 257/722; 257/706
(58) Field of Search ....................... 361/701–705, 361/706–712, 717–719, 722; 257/705, 706, 257/707, 713, 717–719, 720–722; 439/68, 439/487; 248/510; 174/16.3; 165/80.3, 185; 24/458

(56) References Cited

U.S. PATENT DOCUMENTS

| 4,291,752 | A | * | 9/1981 | Bridgnell ....................... 165/81 |
| 4,291,754 | A | * | 9/1981 | Morse et al. ................ 165/165 |
| 5,020,586 | A | * | 6/1991 | Mansingh ................... 165/80.3 |
| 5,509,465 | A | * | 4/1996 | Lai ............................ 165/80.3 |
| 5,593,012 | A | * | 1/1997 | Aho ........................... 192/56.1 |
| 5,654,587 | A | * | 8/1997 | Schneider et al. ........... 257/718 |
| 5,699,853 | A | * | 12/1997 | Goth et al. ............. 165/104.21 |
| 5,912,802 | A | * | 6/1999 | Nelson ........................ 361/695 |
| 5,946,190 | A | * | 8/1999 | Patel et al. .................. 361/700 |
| 5,959,837 | A | * | 9/1999 | Yu .............................. 361/697 |
| 6,034,430 | A | * | 3/2000 | Hamburgen et al. ......... 257/722 |
| 6,062,301 | A | * | 5/2000 | Lu ............................. 165/80.3 |
| 6,076,594 | A | * | 6/2000 | Kuo ........................... 165/80.3 |
| 6,189,601 | B1 | * | 2/2001 | Goodman et al. .......... 165/80.3 |
| 6,289,975 | B2 | * | 9/2001 | Kuo ........................... 165/80.3 |
| 6,352,104 | B1 | * | 3/2002 | Mok ........................... 165/80.3 |
| 6,404,632 | B1 | * | 6/2002 | Forkas ........................ 361/703 |
| 6,450,250 | B2 | * | 9/2002 | Guerrero ............... 165/104.33 |
| 6,651,734 | B1 | * | 11/2003 | Liu ............................. 165/80.3 |
| 6,827,136 | B2 | * | 12/2004 | Liu ........................ 165/104.33 |
| 6,842,342 | B1 | * | 1/2005 | Lin ............................. 361/710 |
| 6,883,592 | B2 | * | 4/2005 | Lee ............................ 165/80.3 |
| 2002/0043360 | A1 | | 4/2002 | Lee |
| 2002/0121358 | A1 | * | 9/2002 | Lee ............................ 165/80.3 |
| 2004/0066628 | A1 | * | 4/2004 | Liu ............................. 361/704 |

FOREIGN PATENT DOCUMENTS

DE        3635901 A1 *  4/1988   ........... H01J 35/10

(Continued)

*Primary Examiner*—Anatoly Vortman
(74) *Attorney, Agent, or Firm*—Wei Te Chung

(57) ABSTRACT

A heat dissipating device includes a retention module (20) around an electronic component (15), a heat sink (30) attached to the retention module, and a fan (90). The heat sink includes a plurality of fins (62, 64, 66, 68) and spacers (52) interleaved between the fins, two heat pipes (80) sequentially extending through lower portions of the fins, the spacers and upper portions of the fins to bond the fins and the spacers together. Each spacer includes a flat bottom face for contacting the electronic component, and an arcuate top face. The fins includes two outer fins, and a plurality of inner fins each defining a cutout (62a, 64a) cooperatively defining a chamber between the outer fins. The chamber and the arcuate spacers facilitate cooling air from the fan to blow to opposite sides of the heat sink thereby improving heat dissipation efficiency of the heat sink.

14 Claims, 6 Drawing Sheets

| | FOREIGN PATENT DOCUMENTS | | WO | WO 00/27177 | 5/2000 |
|----|--------|--------|----|-------------|--------|
| TW | 443716 | 6/2001 | | | |
| TW | 524433 | 3/2003 | * cited by examiner | | |

HEAT DISSIPATING DEVICE FOR ELECTRONIC COMPONENT

BACKGROUND OF THE INVENTION

1. Field of the Invention

The present invention relates to a heat dissipating device for electronic components, and particularly to a heat dissipating device incorporating a plurality of stacked fins.

2. Prior Art

Electronic devices such as central processing units (CPUs) generate a lot of heat during normal operation. This can deteriorate their operational stability and damage associated electronic devices. Thus the heat must be removed quickly to ensure normal operation. A heat dissipating device is often attached to a top surface of a CPU, to remove heat therefrom.

A conventional heat dissipation device is made by extrusion, which significantly limits the height of its formed fins. To resolve the problem, another kind of heat dissipating device has been developed. Fins of such device are folded from a metal sheet. The folded fins are then adhered to a base which is for contacting an electronic component. The device has a large heat dissipating surface area. However, because the fins are adhered to the base air gap inevitablely exists between the base and the fins. This reduces heat transmit efficiency from the base to the fins.

To solve the above-mentioned problems, another kind of heat dissipating device has been developed. FIG. 6 shows such a kind of heat dissipating device 1. The heat dissipating device are formed from a plurality of stacked fins 2. The fins comprises a plurality of tall fins 2a and a plurality of short fins 2b interleaved between the tall fins 2a. The tall fins 2a and the short fins 2b are bound together at a binding portion. The binding portion is for contacting an electronic component 3 to absorb heat therefrom. However, a cooling fan cannot be easily and securely attached to the fins 2. The device 1 generally removes heat without the benefit of a fan. This limits heat conduction, thereby reducing the efficiency of heat transfer. Thus the device 1 can not reliably remove heat from the electronic component 3.

SUMMARY OF THE INVENTION

Accordingly, an object of the present invention is to provide a heat dissipating device which can efficiently dissipate heat from an electronic component.

To achieve the above-mentioned object, a heat dissipating device in accordance with the present invention comprises a retention module around an electronic component, a heat sink, and a fan. The heat sink comprises a plurality of fins and a plurality of spacers interleaved between bottom portions of the fins, a pair of heat pipes sequentially extending through the lower portions of the fins, the spacers and upper portions of the fins to bond the fins and the spacers together, and a locking part attaching the heat sink to the retention module. Each spacer comprises a flat bottom face for contacting the electronic component, and an arcuate top face. The fins comprises a pair of outer fins, and a plurality of inner fins each defining a cutout in a top portion thereof. The cutouts of the inner fins cooperatively define a chamber between the outer fins. The chamber and the arcuate spacers facilitate cooling air from the fan to blow to opposite sides of the heat sink thereby improving heat dissipation efficiency of the heat sink Other objects, advantages and novel features of the present invention will be drawn from the following detailed description of a preferred embodiment of the present invention with attached drawings, in which:

DETAILED DESCRIPTION OF THE INVENTION

Figure 1:
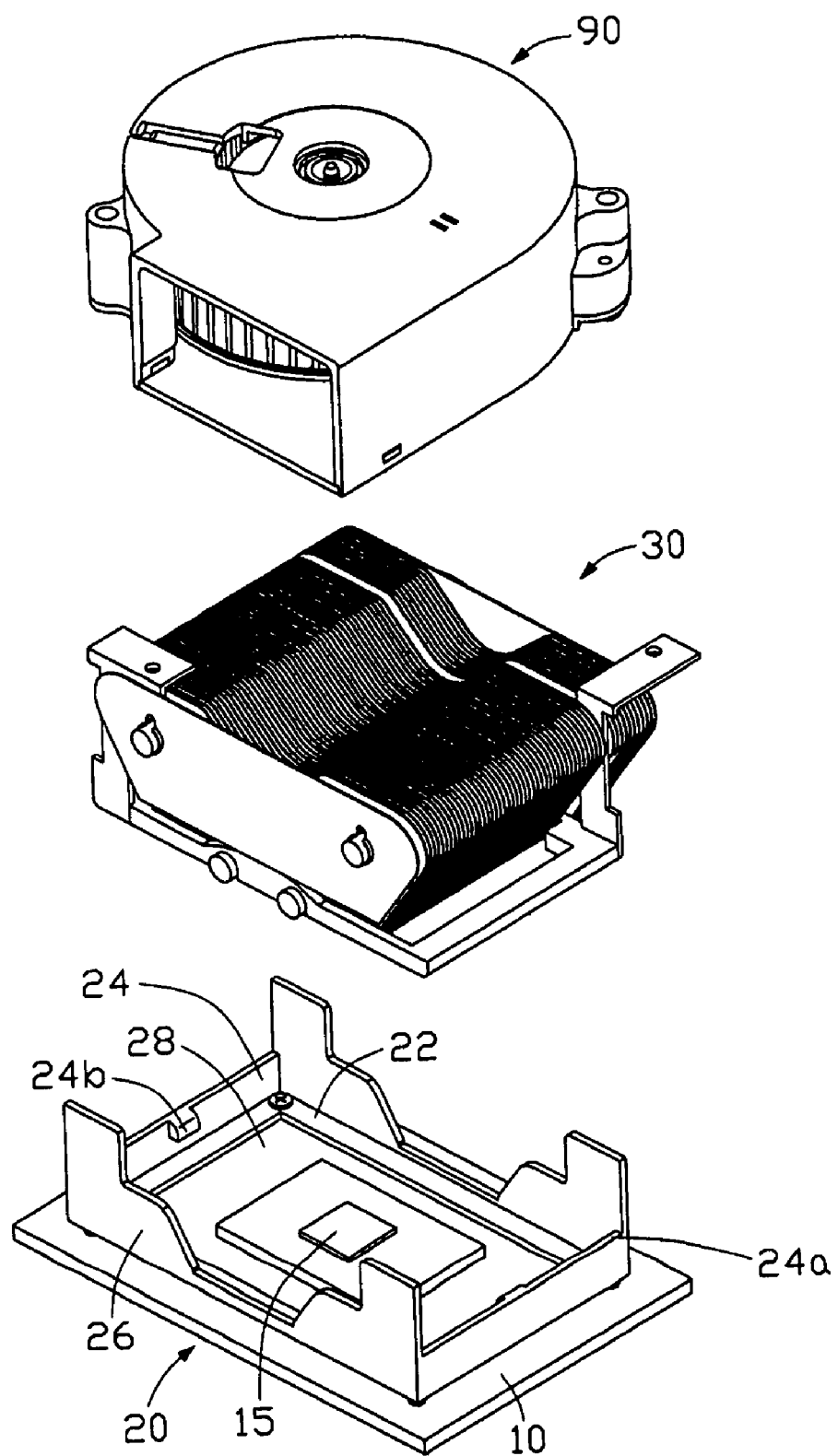
FIG. 1 is an exploded, isometric view of a heat dissipating device in accordance with a preferred embodiment of the present invention, together with a circuit board.

Referring to FIG. 1, a heat dissipating device in accordance with the preferred embodiment of the present invention comprises a rectangular retention module 20, a heat sink 30, and a fan 90.

The retention module 20 is mounted on a circuit board 10. An electronic component 15, such as, a Central Processing Unit (CPU), is mounted on the circuit board 10. The retention module 20 comprises a bottom plate 22, a pair of lateral sidewalls 24 extending upwardly from opposite lateral side edges of the bottom plate 22, and a pair of longitudinal sidewalls 26 extending upwardly from opposite longitudinal side edges of the bottom plate 22. An opening 28 is defined in the bottom plate 22. Each lateral sidewall 24 defines a cutout 24a in a top portion thereof, the cutout 24a spanning from one of the longitudinal sidewalls 26 to the other longitudinal sidewall 26. A barb 24b is formed in a middle portion of the lateral sidewall 24.

Figure 2:
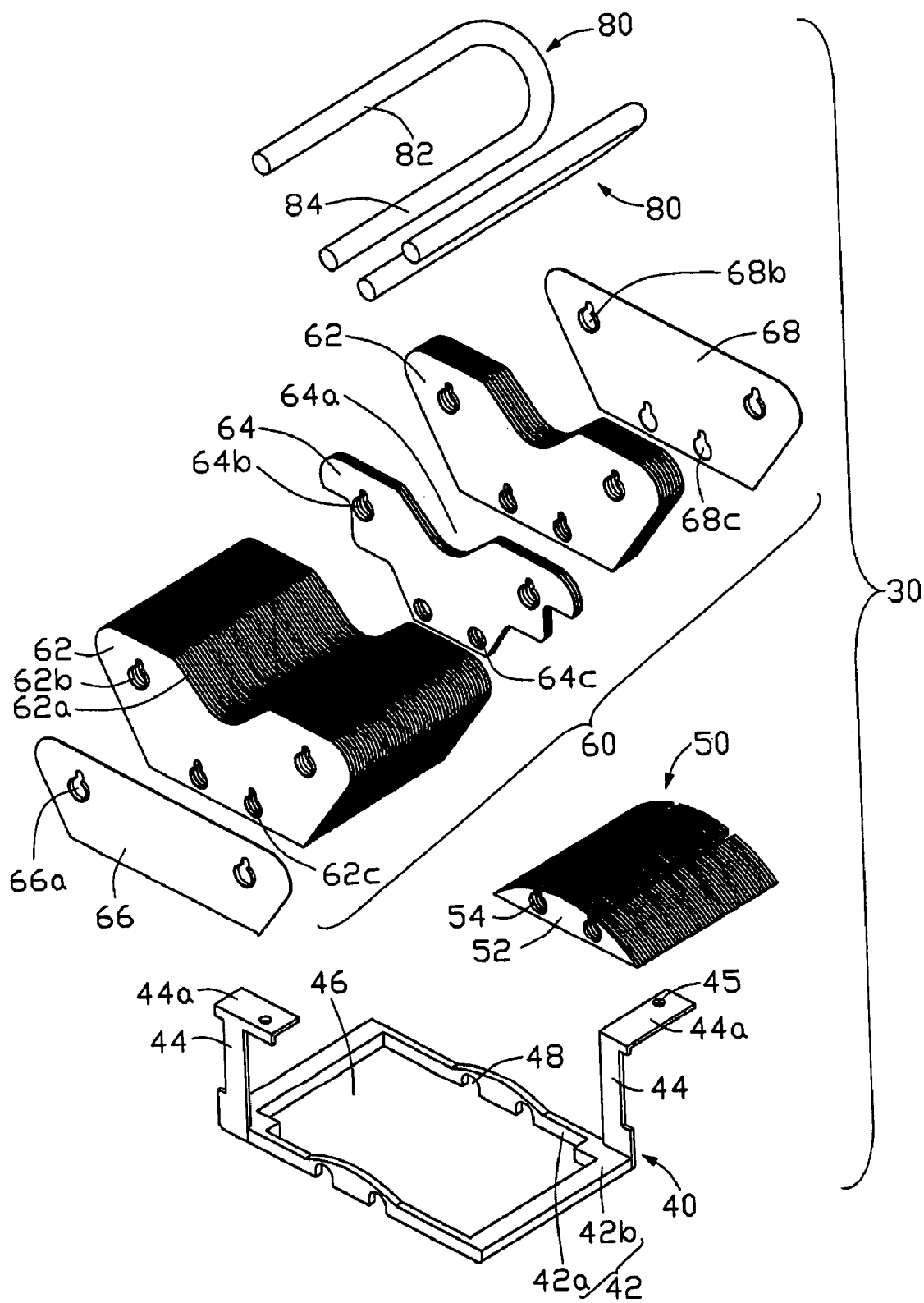
FIG. 2 is an exploded view of a heat sink of the heat dissipating device of FIG. 1.

Referring to FIG. 2, the heat sink 30 comprises a locking part 40, a base part 50, a fin part 60, and a pair of heat pipes 80. The locking part 40 comprises a frame 42 and a pair of locking plates 44 extending upwardly from diagonal corners of the frame 42 respectively. The frame 42 comprises a pair of longitudinal beams 42a and a pair of lateral beams 42b cooperatively defining an opening 46 therebetween Each longitudinal beam 42a defines a pair of spaced notches 48 in a middle portion thereof. The locking plate 44 is L-shaped and forms a mounting tab 44a on a top end thereof. A mounting hole 45 is defined in the mounting tab 44a.

The base part 50 comprises a plurality of stacked parallel spacers 52. The spacer 52 is arcuate shaped and defines a pair of spaced holes 54 therein. The fin part 60 comprises a plurality of parallel first inner fins 62, a plurality of second inner fins 64, a first outer fin 66 and a second outer fin 68. Each first inner fin 62 defines a cutout 62a in a middle top portion thereof. A pair of first through holes 62b is defined in an upper portion of the first inner fin 62a. A pair of second through holes 62c is defined in a lower portion of the first inner fin 62. Each second inner fin 64 defines a cutout 64a in a middle top portion thereof. A pair of first through holes 64b is defined in an upper portion of the second inner fin 64. A pair of second through holes 64c is defined in a lower portion of the second inner fin 64. The second inner fin 64 has a contour corresponding to a contour of the longitudinal sidewall 26. The first outer fin 66 is in trapeziform shape and defines a pair of first through holes 66a in an upper portion thereof. The second outer fin 68 is in trapeziform shape and defines a pair of first through holes 68b in an upper portion thereof and a pair of second through holes 68c in a lower portion thereof.

The heat pipe 80 is U-shaped and comprises an upper portion 82 and a lower portion 84.

Figure 3:
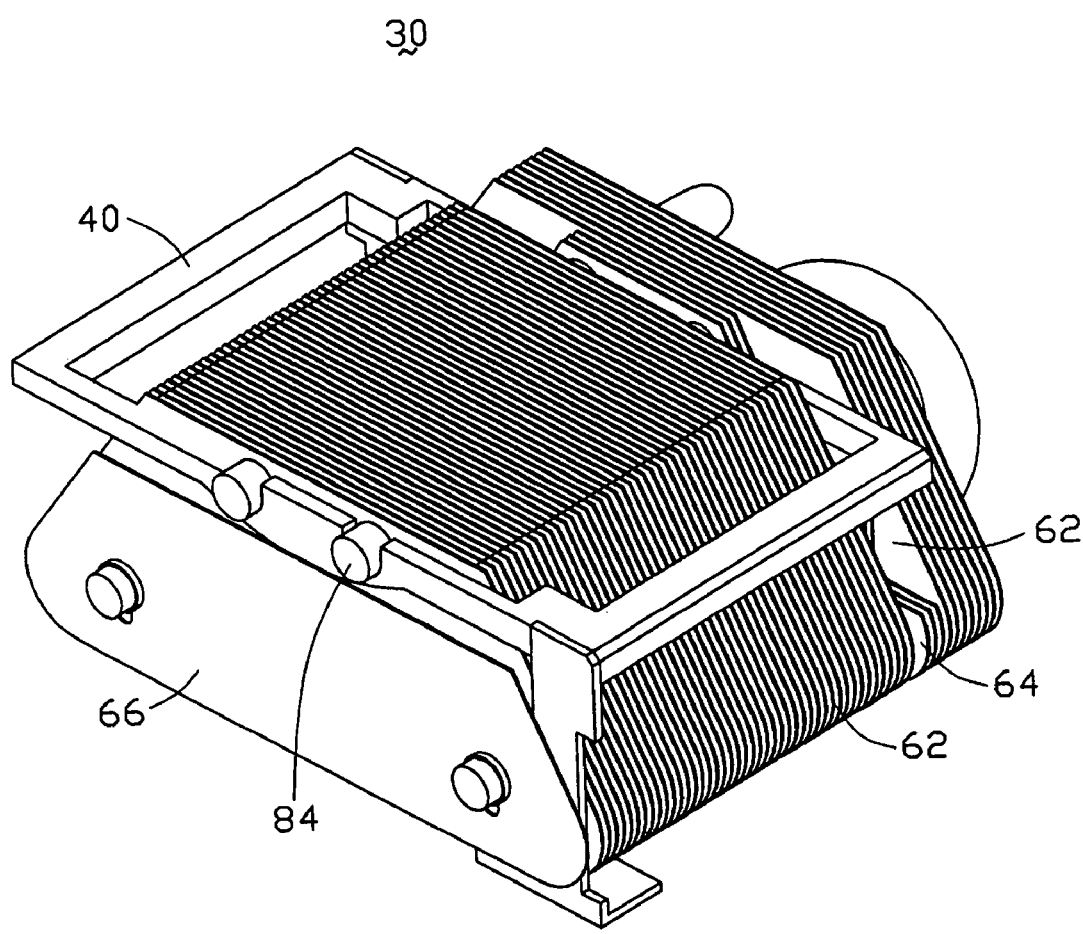
FIG. 3 is an assembled view of FIG. 2 but showing heat dissipating device positioned upside-down.

Referring to FIG. 3, in pre-assembly, the upper portions 82 of the heat pipes 80 extend sequentially through the first through holes 68b, 62b, 64b, 66a of the fin part 60 and the lower portions 84 of the heat pipes 80 extend sequentially through the second through holes 68c, 62c, 64c of the fin part 60 and the through holes 54 of the base part 50. The spacers 52 of the base part 50 and the inner fins 62, 64 of the fin part 60 are therefore alternately surround the heat pipes 80. The locking part 40 is attached to the heat pipes 80 with the lower portions 84 of the heat pipes 80 received in the notches 48 of the locking part 40. The heat pipes 80, the fin part 60, the base part 50 and the locking part 40 are then bond together by way of soldering. The cutouts 62a, 64a of the inner fins 62, 64 cooperatively define a chamber (not labeled) between the two outer fins 66, 68.

Figure 4:
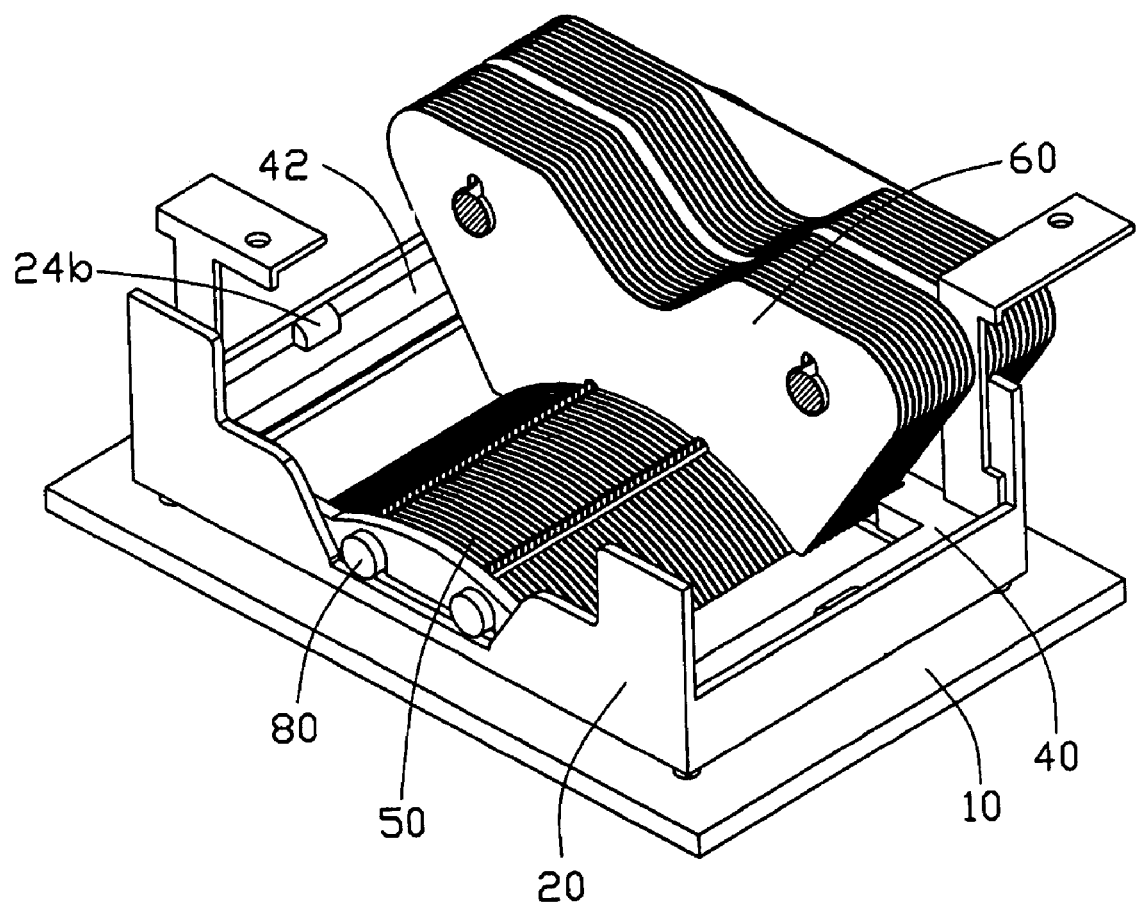
FIG. 4 is a partly assembled view of FIG. 1.
Figure 5:
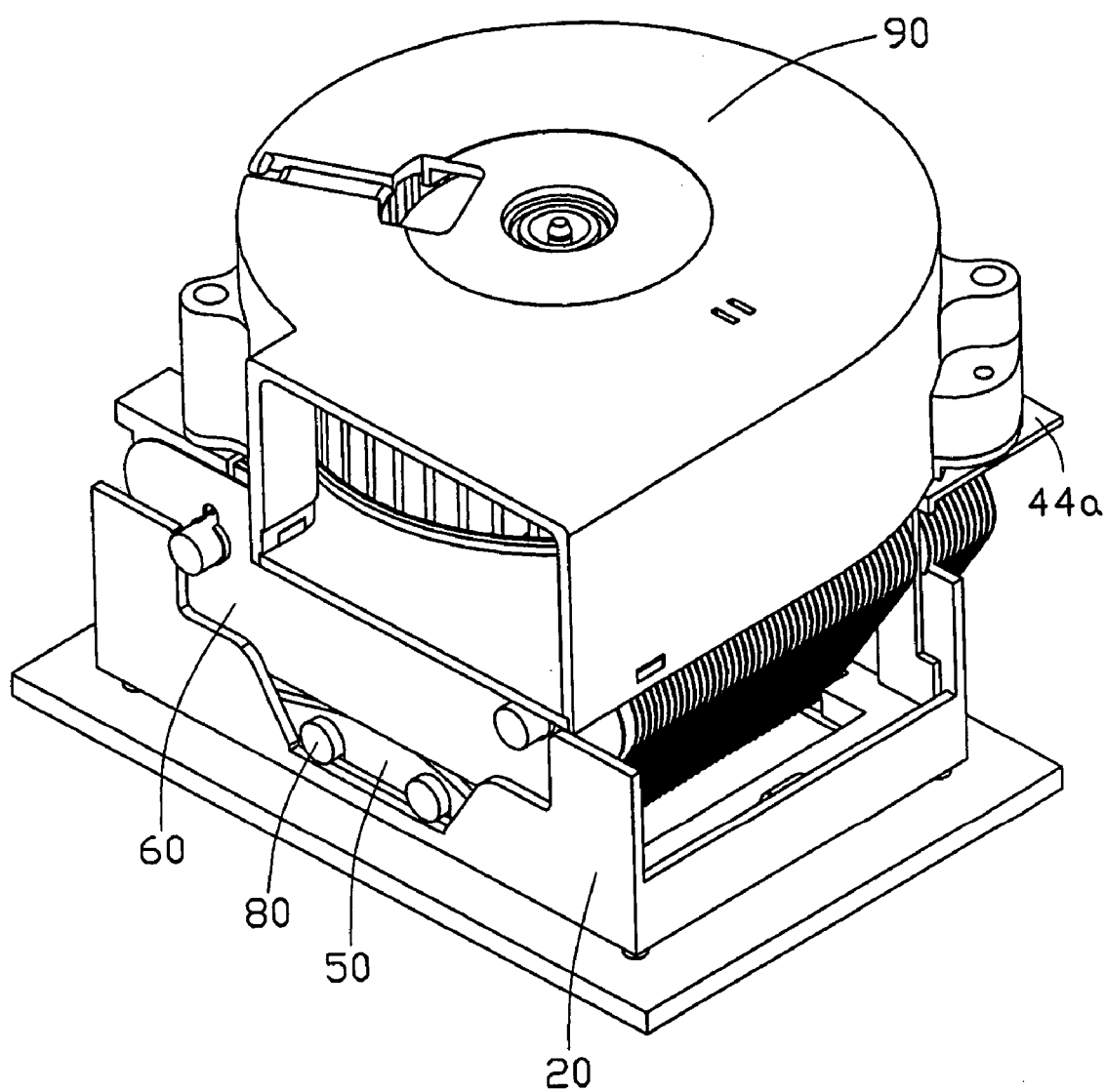
FIG. 5 is a fully assembled view of FIG. 1.
Figure 6:
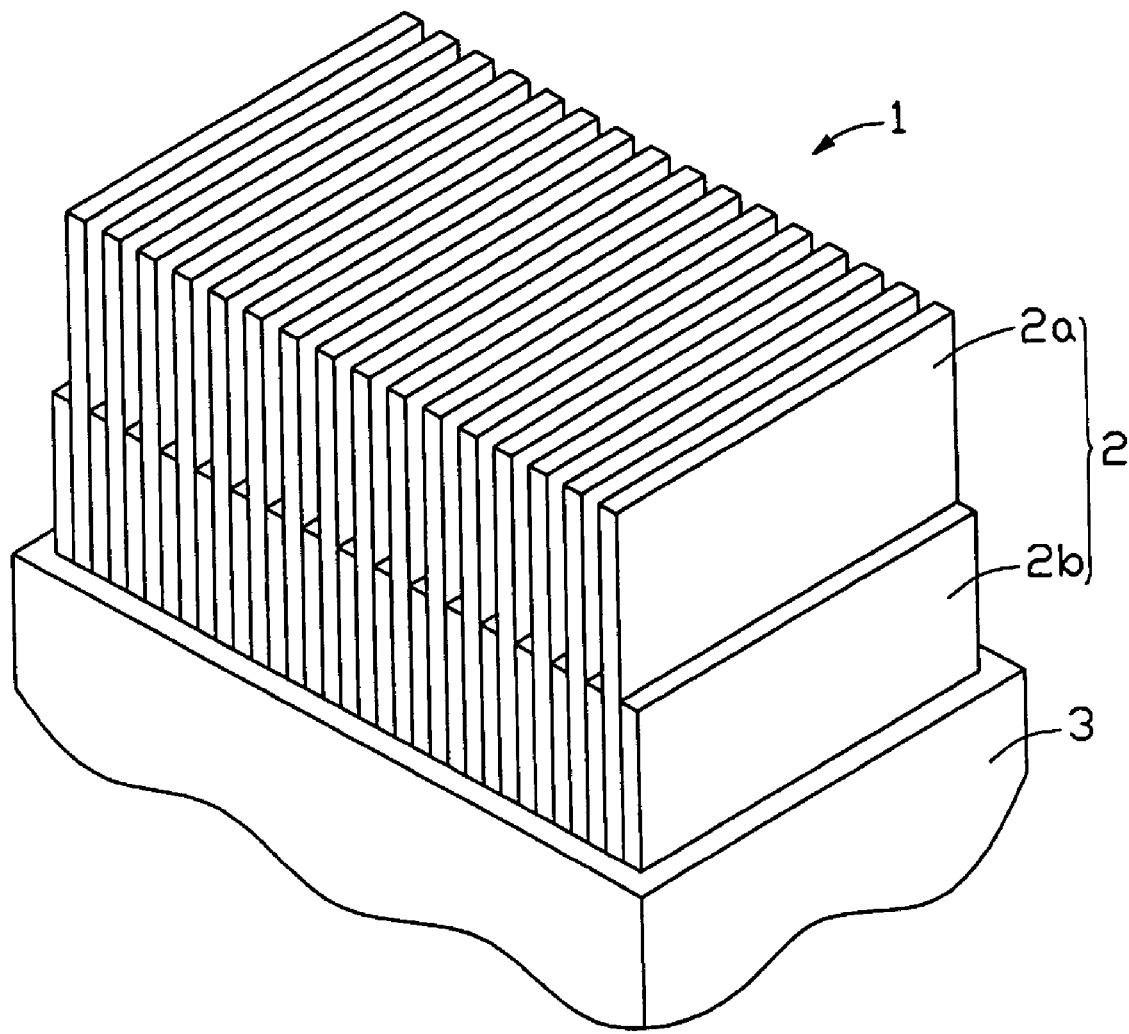
FIG. 6 is an isometric view of a conventional heat dissipating device mounted on an electronic component.

Referring also to FIGS. 4–5, in use, the lateral beams 42b of the locking part 40 slide over the barbs 24b of the retention module 20 to snappily engage with the barbs 24b. The heat sink 30 is attached to the CPU within the retention module 20. The fan 90 is then attached to the mounting tabs 44a of the locking part 40 by fasteners (not shown).

In the present invention, the heat sink 30 are formed by a plurality of fins 62, 64, 66, 68 and spacers 52 interleaved between bottom portions of the fins 62, 64, 66, 68. The inner fins 62, 64 each defines a cutout 62a, 64a in a middle top portion thereof cooperatively defining a chamber between the outer fins 66, 68.

The chamber and the arcuate spacers 52 facilitate cooling air from the fan 90 to blow to opposite sides of the fin part 60 thereby improving heat transfer of the heat sink 30.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat sink for a heat generating component, the heat sink comprising:
   a base part for contacting with the heat generating component, the base part comprising a plurality of arcuate spacers;
   a fin part comprising a pair of outer fins and a plurality of inner fins cooperatively defining a chamber between the outer fins; and
   a heat pipe extending through the base part and the fin part and bonding the base part and the fin part together with the spacers interleaved between the inner fins, wherein the chamber and the arcuate spacers cooperatively facilitate cooling air from a top side of the fin part to blow to opposite sides of the fin part thereby improving heat dissipation efficiency of the heat sink.

2. The heat sink as claimed in claim 1, wherein each spacer comprises a flat bottom face for contacting with the heat generating component and an arcuate top face.

3. The heat dissipating device as claimed in claim 1, wherein each inner fin defines a V-shaped cutout in a top portion thereof, the cutouts of the inner fins cooperatively form the chamber.

4. The heat sink as claimed in claim 1, wherein the heat pipe is U-shaped, each inner fin defines a pair of through holes, and each spacer defines a through hole aligned with one of the through holes of the inner fin, the heat pipe extending through the through holes of the spacers and the through holes of the inner fins.

5. A heat dissipating device assembly comprising:
   a circuit board having an electronic component mounted thereon;
   a retention module mounted on the circuit board;
   a heat sink attached to the retention module, the heat sink comprising:
   a plurality of fins and a plurality of arcuate spacers interleaved between lower portions of the fins, the spacers contacting the electronic component;
   a heat pipe sequentially extending through the lower portions of the fins, the spacers and upper portions of the fins to bond the fins and the spacers together; and
   a fan mounted on the heat sink, wherein
   the arcuate spacer facilitates cooling air from the fan to blow to opposite sides of the fins thereby improving heat dissipation efficiently of the heat sink.

6. The heat dissipating device assembly as claimed in claim 5, wherein the heat sink further comprises a locking part, the locking part comprises a frame fixed with the heat sink, and a pair of locking plates supported the fan thereon.

7. The heat dissipating device assembly as claimed in claim 6, wherein the retention module comprises a bottom plate defining an opening for extension of the electronic component therethrough to contact the spacers, and a pair of lateral sidewalls each defining a barb engaging with the frame of the locking part to thereby attach the heat sink to the electronic component.

8. The heat dissipating device assembly as claimed in claim 5, wherein the fins
   comprises a pair of outer fins and a plurality of inner fins between the outer fins, and each of the inner fins defines a V-shaped cutout in a top portion thereof, the cutouts cooperatively forming a chamber between the outer fins.

9. The heat dissipating device assembly as claimed in claim 5, wherein each spacer comprises a flat bottom face contacting the electronic component and an arcuate top face.

10. The heat dissipating device assembly as claimed in claim 5, wherein the heat pipe is U-shaped, each inner fin defines a pair of through holes, and each spacer defines a through hole aligned with one of the through holes of the inner fin, the heat pipe extending through the through holes of the spacers and the through holes of the inner fins.

11. A heat sink assembly comprising:
   a locking part including a frame defining an opening;
   a base part including a plurality of shorter spacers;
   a fin part including a plurality of higher inner fins;
   said spacers being interleaved between bottom portions of said inner fins so as to form a stack including the alternately arranged inner fins and spacers along a horizontal direction under a condition that the interleaved spacer and bottom portions of the inner fins are restrained in the opening of the frame; and
   at least one heat pipe extending through said interleaved inner fins and spacers; wherein
   a fan is secured to said locking part above both the frame and the interleaved inner fins and spacers.

12. The assembly as claimed in claimed 11, wherein upper portions of the inner fins are configured with curved edges, and upper portions of the spacers are configured with complementary curved edges to commonly define a sand glass configuration for improving heat dissipation.

13. The assembly as claimed in claim 11, wherein said heat pipe further extend through said frame.

14. The assembly as claimed in claim 11, wherein extension of the heat pipe through all said frame and said interleaved inner fins and spacers, occurs at a same level.

* * * * *